United States Patent
Guillorn et al.

(10) Patent No.: US 10,741,641 B2
(45) Date of Patent: Aug. 11, 2020

(54) DIELECTRIC ISOLATION AND SIGE CHANNEL FORMATION FOR INTEGRATION IN CMOS NANOSHEET CHANNEL DEVICES

(71) Applicant: International Business Machines Corporation, Armonk, NY (US)

(72) Inventors: Michael A. Guillorn, Cold Springs, NY (US); Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 133 days.

(21) Appl. No.: 16/013,247

(22) Filed: Jun. 20, 2018

(65) Prior Publication Data
US 2019/0393304 A1 Dec. 26, 2019

(51) Int. Cl.
| | |
|---|---|
| *H01L 29/06* | (2006.01) |
| *H01L 21/84* | (2006.01) |
| *H01L 21/02* | (2006.01) |
| *H01L 21/3065* | (2006.01) |
| *H01L 21/308* | (2006.01) |
| *H01L 21/324* | (2006.01) |
| *H01L 29/66* | (2006.01) |
| *H01L 21/3105* | (2006.01) |
| *H01L 21/8238* | (2006.01) |
| *H01L 27/092* | (2006.01) |

(52) U.S. Cl.
CPC ...... *H01L 29/0673* (2013.01); *H01L 21/0228* (2013.01); *H01L 21/02532* (2013.01); *H01L 21/308* (2013.01); *H01L 21/3065* (2013.01); *H01L 21/31058* (2013.01); *H01L 21/324* (2013.01); *H01L 21/84* (2013.01); *H01L 29/0649* (2013.01); *H01L 29/66795* (2013.01); *H01L 21/823807* (2013.01); *H01L 21/823878* (2013.01); *H01L 27/0924* (2013.01)

(58) Field of Classification Search
CPC .......... H01L 29/0673; H01L 29/66795; H01L 29/0649; H01L 21/31058; H01L 21/02532; H01L 21/0228; H01L 21/84; H01L 21/308; H01L 21/324; H01L 21/3065; H01L 21/823807; H01L 21/823878; H01L 27/0924; H01L 27/092
See application file for complete search history.

(56) References Cited

U.S. PATENT DOCUMENTS

| | | | |
|---|---|---|---|
| 7,074,623 B2 | 7/2006 | Lochtefeld et al. | |
| 8,324,660 B2 | 12/2012 | Lochtefeld et al. | |

(Continued)

*Primary Examiner* — William F Kraig
*Assistant Examiner* — Vicki B. Booker
(74) *Attorney, Agent, or Firm* — Cantor Colburn LLP; Vazken Alexanian

(57) ABSTRACT

Method for forming dielectric isolation region and SiGe channels for CMOS integration of nanosheet devices generally includes epitaxially growing a multilayer structure including alternating layers of silicon, silicon germanium having a germanium content of x atomic percent and silicon germanium having a germanium content of at least 25 atomic percent greater than x. The alternating layers can be arranged and selectively patterned to form a nitride dielectric isolation region, silicon nanochannels in the NFET region, and silicon germanium nanochannels in the PFET region.

20 Claims, 8 Drawing Sheets

(56) References Cited

U.S. PATENT DOCUMENTS

| | | |
|---|---|---|
| 8,859,389 B2 | 10/2014 | Kawasaki et al. |
| 8,969,155 B2 | 3/2015 | Cheng et al. |
| 9,252,016 B2 | 2/2016 | Cheng et al. |
| 9,418,900 B1 | 8/2016 | He et al. |
| 9,660,028 B1 * | 5/2017 | Cheng ................. H01L 29/0673 |
| 2008/0135949 A1 | 6/2008 | Lo et al. |
| 2012/0032265 A1 | 2/2012 | Simonelli et al. |
| 2013/0316513 A1 | 11/2013 | Basker et al. |
| 2014/0273412 A1 | 9/2014 | Wu et al. |

* cited by examiner

DIELECTRIC ISOLATION AND SIGE CHANNEL FORMATION FOR INTEGRATION IN CMOS NANOSHEET CHANNEL DEVICES

BACKGROUND

The present invention relates in general to integrated circuit device structures and their fabrication. More particularly, the present invention relates to dielectric isolation and SiGe formation for integration in complementary metal oxide semiconductor (CMOS) nanosized channel devices.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

Non-planar MOSFET architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistors enable fuller depletion in the nanosheet channel regions and reduce short-channel effects.

SUMMARY

Embodiments of the present invention are generally directed complementary metal oxide semiconductor (CMOS) devices. A non-limiting example of a method for forming a CMOS semiconductor device according to one or more embodiments of the present invention includes epitaxially growing a multilayer structure on a substrate in an NFET region and a PFET region. The multilayer structure includes a silicon layer sandwiched between SiGe(x) layers, and SiGe(x+25) layers sandwiched between the SiGe(x) layers, wherein a bottommost layer is a sacrificial dielectric isolation layer including the SiGe(x+25). The sacrificial dielectric isolation layer is at a thickness greater than each of the SiGe(x+25) layers sandwiched between the SiGe(x) layers, wherein (x) is from about 5 atomic percent to about 50 atomic percent. The multilayer structure is patterned to form one or more nanosheet stacks in the NFET region and the PFET region. The SiGe(x+25) layers are selectively removed from each of the nanosheet stacks in both the NFET and PFET regions, wherein selectively removing the SiGe(x+25) layers forms a space between the SiGe(x) layers and a space between the substrate and a lowermost one of the SiGe(x) layers. An oxide layer is conformally deposited on the substrate, wherein the oxide layer is at a thickness effective to fill the space between the SiGe(x) layers and form the oxide layer on the substrate. A nitride layer is conformally deposited on the substrate, wherein the nitride layer is at a thickness effective to fill the space between the SiGe(x) layers and the substrate provide the oxide layer on the substrate. The nitride layer is selectively removed such that the nitride layer remains in the space between the SiGe(x) layers and the substrate. The PFET region is blocked followed by removing the oxide layer and SiGe(x) layers from the nanosheet stack in the NFET region. The block is removed from the PFET region and the substrate heated to diffuse the germanium in the SiGe(x) layer into the silicon layer to form a germanium diffused silicon layer in the PFET region. The NFET region is blocked followed by removing the oxide layer and thinning the germanium diffused silicon layer from the nanosheet stack in the NFET region. The blocking is removed from the NFET region.

A non-limiting example of a method for forming nanochannels in a CMOS semiconductor device according to one or more embodiments of the present invention includes epitaxially growing a sacrificial dielectric isolation layer at a thickness of about 8 nm to about 12 nm on a substrate, wherein the sacrificial dielectric isolation layer includes SiGe(x+25). A multilayer structure is epitaxially grown on the sacrificial dielectric isolation layer. The multilayer structure includes a silicon layer at a thickness of about 4 nm to 8 nm sandwiched between SiGe(x) layers at a thickness of about 2 nm to 4 nm and SiGe(x+25) layers at a thickness of about 2 nm to about 4 nm sandwiched between the SiGe(x) layers. The multilayer structure is patterned to form one or more nanosheet stacks in an NFET region and a PFET region. The SiGe(x+25) layers material layers are selectively removed to form a first space between from the SiGe(x) layers and a second space from the sacrificial dielectric isolation region. An oxide layer is conformally deposited at a thickness effective to fill the first space between the SiGe(x) layers. A nitride layer is conformally deposited on the substrate and at a thickness effective to fill the second space. The nitride layer is removed from surfaces other than the second space such that the nitride layer fills the second space and forms a dielectric isolation region between the substrate and each of the nanosheet stacks. The PFET region is blocked followed by removing the oxide layer and SiGe (x) layers from the one or more nanosheet stacks in the NFET region. The blocking is removed from the PFET region and the substrate is heated to diffuse the germanium in the SiGe(x) layer into the silicon layer to form a germanium diffused silicon layer in the PFET region. The NFET region is blocked followed by removing the oxide layer and thinning the germanium diffused silicon layer from the nanosheet stack in the NFET region. The blocking is removed from the NFET region.

A non-limiting example of a method for forming a CMOS semiconductor device according to one or more embodiments of the present invention includes epitaxially growing a sacrificial dielectric isolation layer at a thickness of about 8 nm to about 12 nm on a substrate, wherein the sacrificial dielectric isolation layer includes SiGe(x+25). A multilayer structure is epitaxially grown on the sacrificial dielectric isolation layer. The multilayer structure including a silicon layer at a thickness of about 4 nm to 8 nm sandwiched between SiGe(x) layers at a thickness of about 2 nm to 4, and SiGe(x+25) layers at a thickness of about 2 nm to about 4 nm sandwiched between the SiGe(x) layers. The multilayer structure is patterned to form one or more nanosheet stacks in an NFET region and a PFET region. The SiGe(x+25) layers are selectively removed to form a first space between from the SiGe(x) layers and a second space from the sacrificial dielectric isolation region. A first oxide layer is conformally deposited at a thickness effective to fill the first space between the SiGe(x) layers. A nitride layer is deposited at a thickness effective to fill the second space. The PFET region is blocked followed by removing the nitride layer from surfaces other than the second space such that the nitride layer fills the second space and forms a dielectric isolation region between the substrate and each of the nanosheet stacks in the NFET region. The SiGe(x) layers are selectively removed from the one or more nanosheet stacks in the NFET region. A second oxide layer is conformally deposited on the silicon layers and the dielectric isolation region in the NFET region, and the one or more nanosheet stacks in the PFET region. The substrate is heated to diffuse the germanium in the SiGe(x) layer into the silicon layer to form a germanium diffused silicon layer in the PFET region. The NFET region is blocked followed by removing the second oxide layer and the nitride layer from the nanosheet stack in the NFET region. The block is removed from the NFET region followed by simultaneously removal of the second oxide layer in the NFET region and the first oxide layer in the PFET region.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
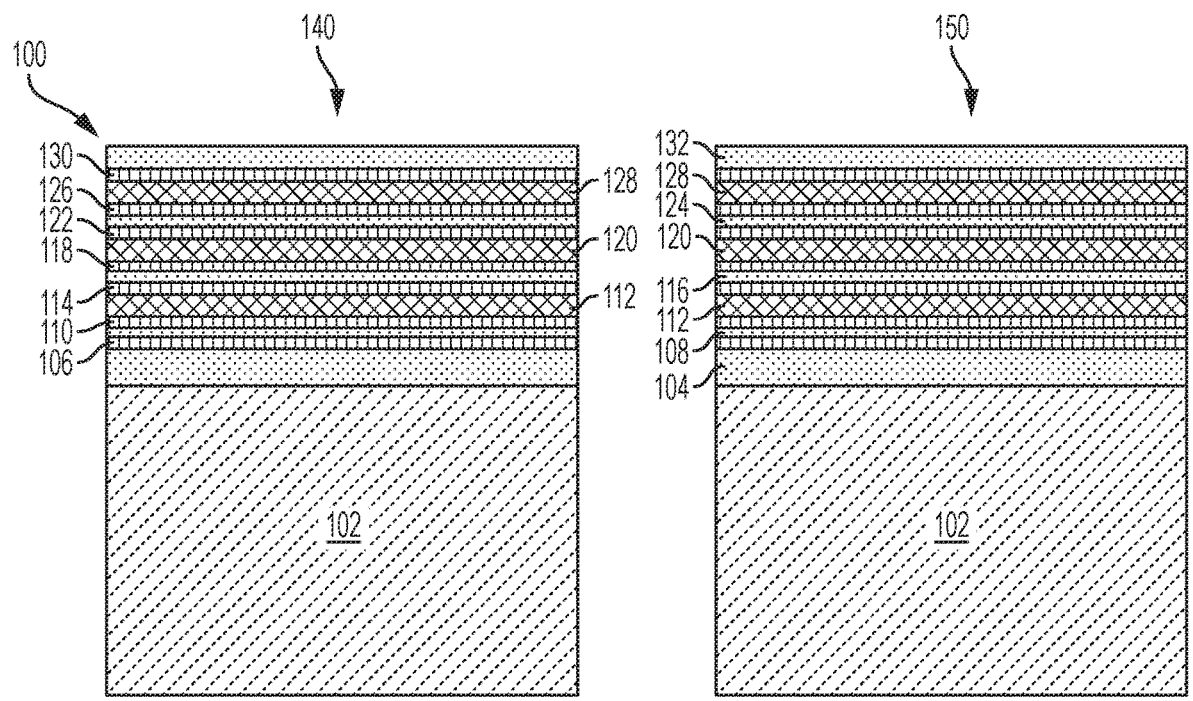
FIG. 1 depicts a cross-sectional view of a semiconductor structure after a fabrication operation according to one or more embodiments of the present invention.

In the present invention, a complementary metal oxide semiconductor (CMOS) device includes an epitaxially grown multilayer structure on a substrate that can be used to form a dielectric isolation region and nanochannels for both nFET and pFET devices. The multilayer structure generally includes an epitaxially grown sacrificial dielectric isolation layer formed of SiGe, wherein the germanium content is relatively high, and alternating layers of epitaxially grown Si and SiGe. As will be described in greater detail below, the germanium content of the SiGe layers varies, wherein the germanium content of select SiGe layers within a nanosheet stack are at a differential of at least 25 atomic percent relative to other SiGe layers The differential of at least 25 atomic percent provides an etch selectivity of at least 30:1 between the different SiGe layers, wherein the higher content germanium layers including the epitaxially grown sacrificial dielectric isolation layer can be selectively removed using HCl vapor etch chemistry, for example.

By way of example, a SiGe layer having 50 atomic percent germanium has an etch selectivity of at least 30:1 relative to a SiGe layer having 25 atomic percent germanium or less when exposed to etching chemistry including HCl vapor.

Advantageously, the epitaxially grown multilayer structure of Si and SiGe layers can be configured and arranged such that the Si channels for the NFET devices and the SiGe channels for the PFET devices as well as the dielectric isolation layer between the channels and the substrate can be formed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor.

When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel region. Disposed above the channel region is a gate electrode. The gate electrode and the channel region are spaced apart by a gate dielectric layer. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a gate all around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels (e.g., Si, SiGe) between the source and drain regions. A gate surrounds the stacked nanosheet channels and regulates electron flow through the nanochannels between the source and drain regions. GAA nanosheet FETs are fabricated by forming alternating layers of channel nanosheets and sacrificial nanosheets that are removed during the fabrication process. For n-type FETs, the channel nanosheets are silicon (Si) and for p-type FETs, the channel nanosheets are SiGe. Forming the GAA nanosheets from alternating layers of channel nanosheets formed from a first type of semiconductor material and sacrificial nanosheets formed from a second type of semiconductor material provides superior channel electrostatics control, which is necessary for continuously scaling gate lengths down to seven (7) nanometer (nm) technology and below.

As previously noted herein, some non-planar transistor architectures such as the nanosheet FET employ semiconductor fins and side-gates that can be contacted outside the active region, resulting in increased device density over lateral devices. There are challenges, however, in providing nanosheet FETs with equal or superior performance characteristics to lateral devices. One such challenge is the mitigation or elimination of the parasitic capacitance associated with nanosheet FETs. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. In a nanosheet FET, a pathway for undesired capacitive coupling between the gate and the substrate can exist when the gate and the substrate are sufficiently close to each other. In known nanosheet FET configurations, the gate is spaced apart from the channel nanosheets and the substrate by a gate dielectric layer. Because it is desirable to use a relatively thin gate dielectric layer between the channel nanosheets and the gate to satisfy other nanosheet FET performance requirements (e.g., low voltage and low power dissipation), known nanosheet FET configurations having thin gate dielectric layers provide a pathway for unwanted capacitive coupling through the gate, the thin gate dielectric, and the substrate.

Another challenge associated with GAA nanosheet FETs is the difficulty in reducing undesirable effects such as short channel effects and punch-through (i.e., leakage currents). Punch-through occurs when an undesired current pathway is formed through a portion of the substrate under the channel and the gate. These undesired current pathways are referred to herein as under channel pathways, which allow leakage currents to pass from the source to the drain of the transistor, bypassing the nanosheets. Forming source/drain (S/D) regions that extend below an upper surface of the substrate (also known as recessed S/D regions), for example, contributes to the formation of an under channel pathway. S/D regions are commonly formed in a junction recess in the substrate in conventional GAA nanosheet FETs. Consequently, an upper region of the substrate between portions of the recessed S/D regions can serve as an under channel pathway. When a voltage is applied to the gate of the nanosheet FET that is greater than a threshold voltage, current flows through the channel nanosheets and through the under channel pathway, reducing channel electrostatics control and ultimately degrading device performance. Consequently, it is desirable to suppress an under channel pathway from conducting undesired leakage currents. Conventional approaches to suppress these under channel pathways have not been wholly successful. In some conventional nanosheet FETs, for example, a surface portion of the substrate is doped using a punch-through-stopper (PTS) scheme to reduce the conductivity of the under channel pathway. The heavy doping associated with PTS, however, results in secondary consequences that degrade device performance (causing, e.g., stacking faults which lead to poor active channel epitaxial growth).

Turning now to an overview of aspects of the present invention, one or more embodiments of the invention provide fabrication methods and resulting structures that reduce unwanted capacitance between the gate and the substrate of a nanosheet FET by providing a dielectric isolation layer between the gate and the substrate. In an example fabrication method according to embodiments of the invention, vertically stacked channel nanosheets are epitaxially formed and/or grown over an epitaxially grown sacrificial dielectric isolation layer including both silicon and germanium, which are formed over a substrate. An oxide layer is formed over each of the nanosheet channels and a nitride layer replaces the sacrificial dielectric isolation layer on the substrate. In this manner, the dielectric isolation layer can include a nitride, e.g. silicon nitride, is formed between the gate and the substrate. The remaining oxide layer, i.e., on the channel nanosheets, is then removed. A gate dielectric layer is deposited on the channel nanosheets and on the isolation dielectric layer, and a gate material is deposited on the gate dielectric layer. Thus, the dielectric isolation layer increases a thickness of dielectric between the gate and the substrate and advantageously reduces capacitive coupling between the gate and the substrate.

Fabrication methods and resulting semiconductor device structures in accordance with embodiments of the invention are described in detail below by referring to the accompanying drawings in FIGS. 1-16.

FIG. 1 depicts a cross-sectional view of a semiconductor structure 100 illustrating a starting structure after initial fabrication operations according to embodiments of the invention. The initial fabrication operations include epitaxially growing a sacrificial dielectric isolation layer 104 of SiGe on a substrate 102, followed by epitaxially growing alternating Si layers 112, 120, 128 and SiGe layers 106, 108, 110, 114, 116, 118, 122, 124, 126, 130 and 132 configured and arranged as shown. The alternating Si and SiGe layers are collectively referred to herein as a nanosheet stack and can be further processed to define the NFET region 140 and the PFET region 150 as will be described below. A shallow trench isolation region (not shown) can be used to separate the NFET region from the PFET region.

As previously discussed, the germanium content of the different SiGe layers varies, wherein the germanium content of select SiGe layers within a nanosheet stack are at a differential of at least 25 atomic percent relative to other SiGe layers As discussed above, the differential of at least 25 atomic percent provides an etch selectivity of at least 30:1 between the different SiGe layers, wherein the higher content germanium layers including the epitaxially grown sacrificial dielectric isolation layer can be selectively removed using HCl vapor etch chemistry, for example.

In the nanosheet stack, SiGe layers 104, 108, 116, 124, and 132 have a higher germanium atomic percent content than SiGe layers 106, 11, 114, 118, 122, 126, 130. Additionally, the SiGe sacrificial dielectric isolation layer 104 has the higher germanium atomic percent content. For convenience and ease in understanding the present invention, SiGe layers with the lower amount of germanium atomic percent will be referred as SiGe(x), i.e., SiGe layers 106, 11, 114, 118, 122, 126, 130 and SiGe layers with the higher amount of germanium atomic percent will be referred to as SiGe (x+25), i.e. SiGe layers 104, 108, 116, 124, 132, wherein SiGe(x+25) refers to a germanium content that is at least 25 atomic percent or more than SiGe(x). The higher germanium content in SiGe(x+25) provides an etch selectivity greater than or equal to 30:1 relative to the lower germanium content SiGe(x).

In one or more embodiments, the SiGe(x) layers can have a Ge concentration from about 5 atomic percent to about 50 atomic percent, and in one or more other embodiments, from about 10 atomic percent to about 40 atomic percent, and from about 20 atomic percent to about 30 atomic percent in still other embodiments, with the proviso that there is a differential of at least 25 atomic percent relative to the SiGe(x+25) layers. In one or more embodiments, the SiGe (x+25) layers can have a Ge concentration from about 30 atomic percent to about 75 atomic percent, and in one or more other embodiments, from about 40 atomic percent to about 60 atomic percent with lower or higher amounts contemplated so long as there is the differential in the germanium content of at least 25 atomic percent between the two types of SiGe layers.

The sacrificial dielectric isolation layer 104 is also be formed of SiGe(x+25) and generally has a thickness greater than the Si and SiGe layers. In one or more embodiments, the dielectric isolation layer is at a thickness of about 8 to about 12 nanometers (nm), the Si layer at a thickness of about 4 to about 8 nm, and the SiGe layers at a thickness of about 2 to about 4 nm. By way of example, the dielectric isolation layer 104 can have a thickness of about 10 nm, the Si layer can have a thickness of about 6 nm and SiGe layers can have a thickness of about 3 nm.

As noted above, the Si and SiGe layers including the sacrificial dielectric isolation layer 104 can be epitaxially grown. The Si and SiGe layers can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Figure 2:
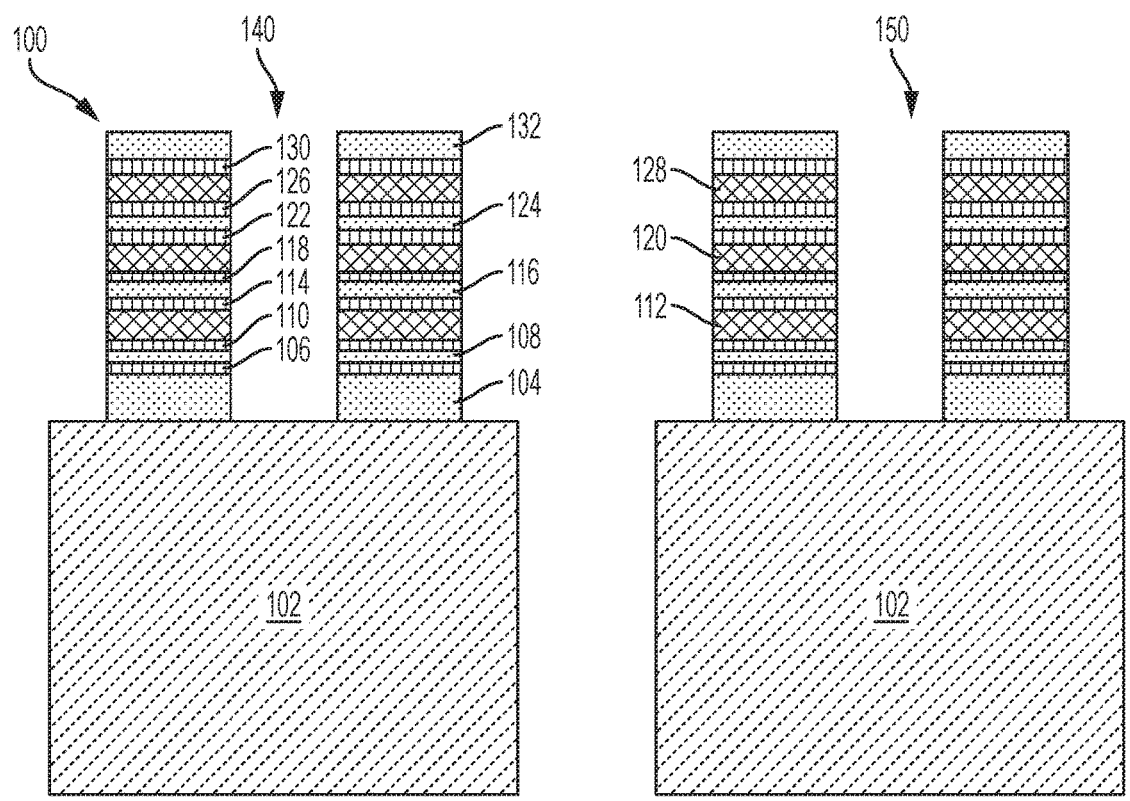
FIG. 2 depicts a cross-sectional view of the semiconductor structure after a fabrication operation according to one or more embodiments of the present invention.
Figure 3:
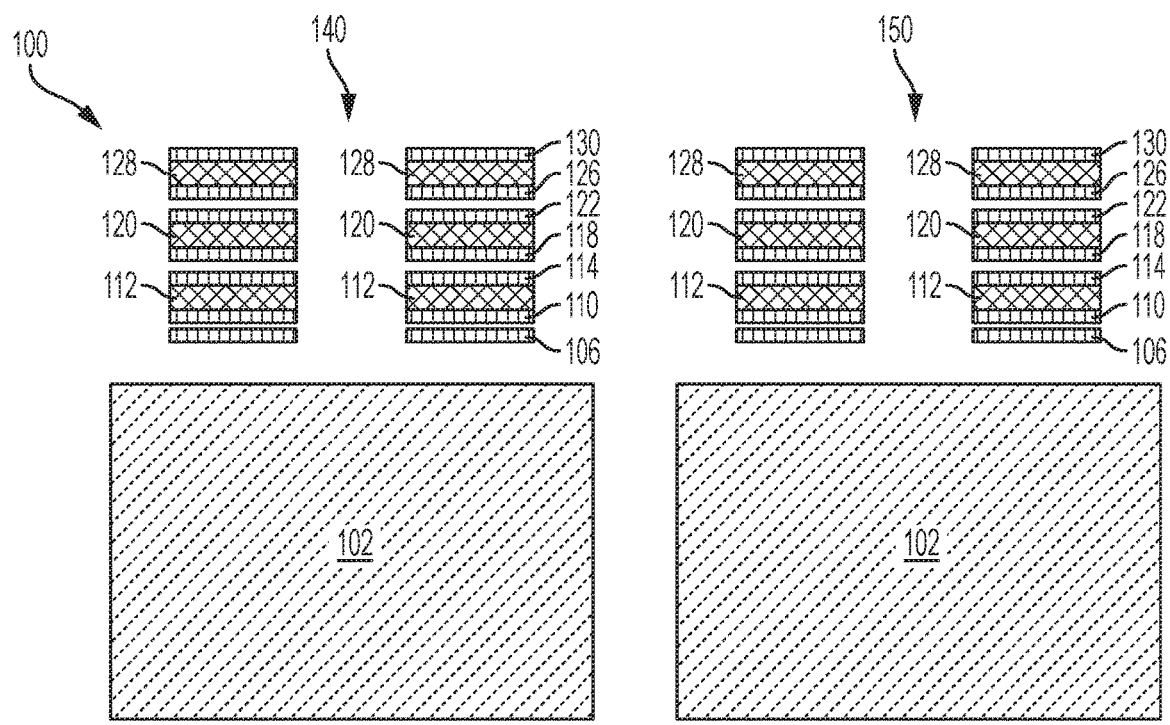
FIG. 3 depicts a perspective view of the semiconductor structure after a fabrication operation according to one or more embodiments of the present invention.

FIG. 2 depicts a cross-sectional view of the semiconductor structure 100 of FIG. 1 after patterning and removal of portions of the nanosheet stack and dielectric isolation layer within the NFET region 140 and the PFET region 150 to expose portions of the substrate 102 during an intermediate fabrication operation according to one or more embodiments. As shown, there are two nano sheet stacks in each of the NFET region 140 and the PFET region 150, which will be utilized to form the nanochannels for two transistors in each region 140, 150. It should be apparent that more or less transistors can be formed as can be desired for the intended application. The portions of the nanosheet stack and dielectric isolation layer can be removed using, for example, a sidewall image transfer (SIT) operation using a wet etch process or a dry etch process. The process can include additional gate all around FET processing steps including, but not limited to, poly open chemical mechanical polishing, dummy poly removal, and removal of a thick oxide as is generally known in the art. The patterned nanosheet stacks in the NFET regions are structurally identical to the patterned nanosheet stacks the PFET regions FIG. 3 depicts a cross-sectional view of the semiconductor structure 100 of FIG. 2 subsequent to selective etch of the SiGe(x+25) layers, which includes removal of sacrificial dielectric layer 104 and layers 108, 116, 124, and 132. Although the remaining layers appear free floating, it should be apparent that these remaining layers are coupled to the source and drains (not shown). The SiGe(x+25) layers can be removed by, for example, exposure to HCl vapor for a period of time and at a temperature effective to remove the SiGe(x+25) relative to the Si and SiGe(x) layers including the thicker sacrificial dielectric isolation layer 104. As noted above, etch selectivities greater than 30:1 have been observed.

Figure 4:
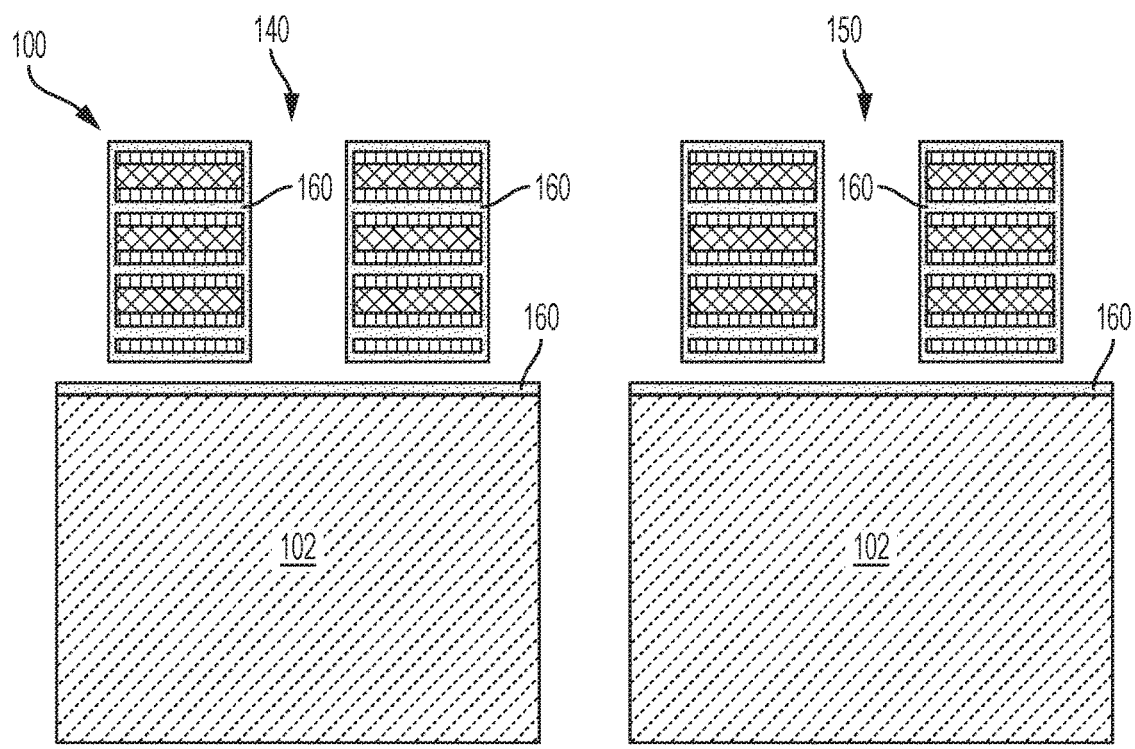
FIG. 4 depicts a cross-sectional view of the semiconductor structure after a fabrication operation according to one or more embodiments of the present invention.

FIG. 4 depicts a cross-sectional view of the semiconductor structure 100 of FIG. 3 subsequent to low temperature plasma assisted atomic layer conformal deposition of an oxide layer, e.g., iRAD conformal deposition of a silicon dioxide. Because the sacrificial dielectric layer 104 was substantially thicker than the SiGe(x+25) layers 108, 116, 124, 132, all of which were previously selectively removed by an HCl vapor etch process, for example, atomic layer deposition can be used to effectively deposit the oxide between the remaining layers, and the top surfaces and sidewalls of the different nanosheet stacks as shown. A thin layer of oxide is provided on the substrate at a thickness effective to pinch off in the spaces provided between the remaining nanosheets. By way of example, the atomic layer deposition process can be configured to deposit 2 nanometers (nm) of oxide when the sacrificial dielectric isolation region was at a thickness of 10 nm and the SiGe(x+25) layers was at a thickness of 3 nm. No pinch off is observed on the surface of the substrate given the thickness differential between the SiGe(x+25) layers 108, 116, 124, 132, and the sacrificial dielectric isolation layer 104.

Figure 5:
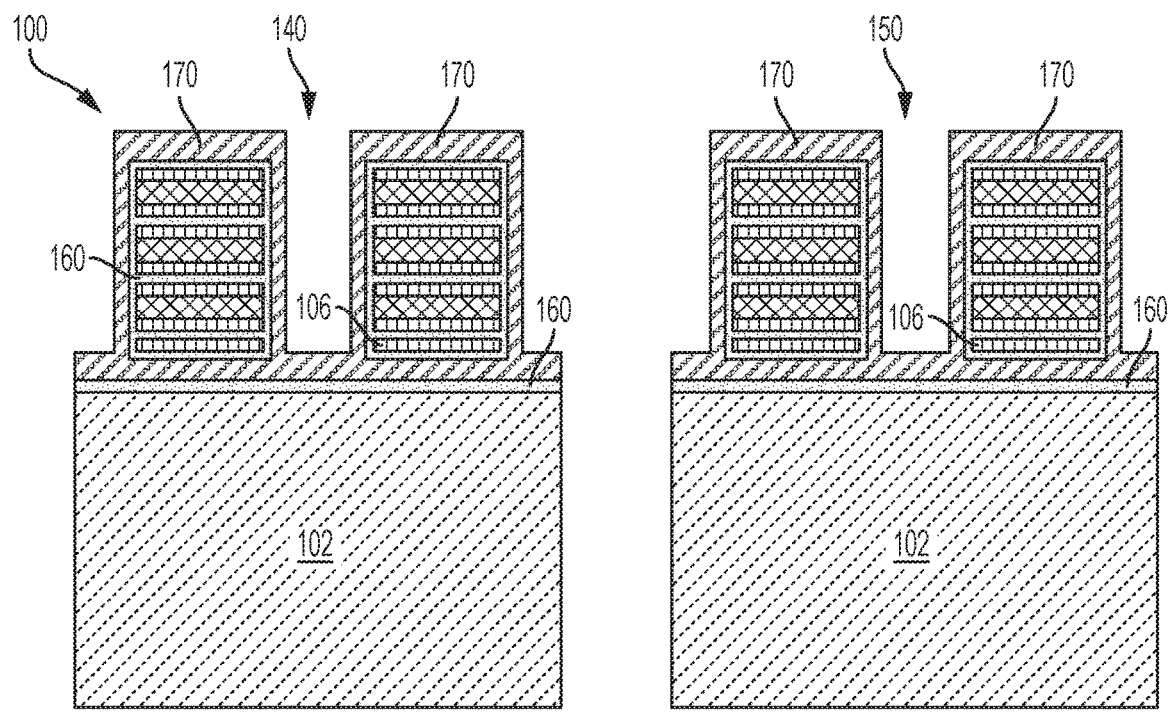
FIG. 5 depicts a cross-sectional view of the semiconductor structure after a fabrication operation according to one or more embodiments of the present invention.

FIG. 5 depicts a cross-sectional view of the semiconductor structure 100 of FIG. 4 subsequent to low temperature plasma assisted atomic layer conformal deposition of a nitride layer, e.g., iRAD conformal deposition of a silicon nitride. The conformal nitride layer is at a thickness effective to fill the space between the oxide layer on the substrate 102 and the oxide layer on the lowermost nanosheet SiGe(x) layer 106. Because the oxide layer 160 fills the space between nanosheets, there is no nitride 170 between the nanosheets since oxide layer is pinched off at the deposited thickness.

Figure 6:
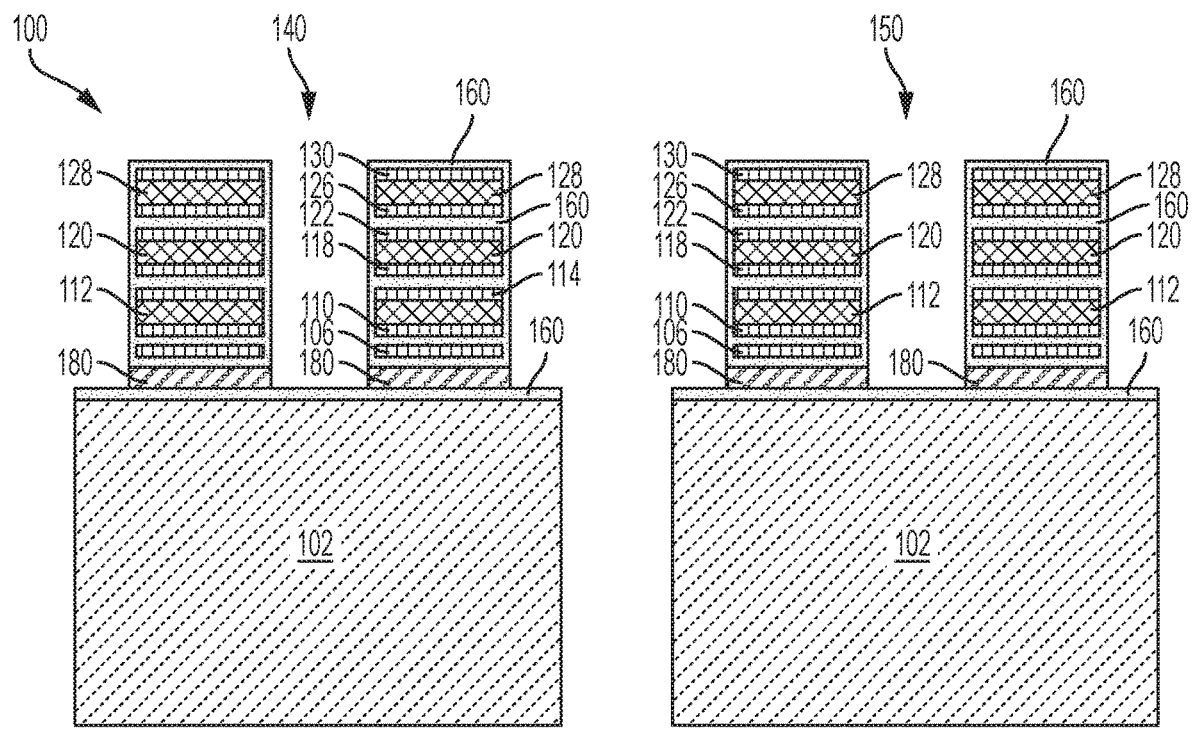
FIG. 6 depicts a cross-sectional view of the semiconductor structure after a fabrication operation according to one or more embodiments of the present invention.

FIG. 6 depicts a cross-sectional view of the semiconductor structure 100 of FIG. 5 subsequent to a directional etch process such as reactive ion etch, a SiCoNi dry cleaning process, a Certas dry cleaning process or the like so as to remove the exposed nitride layer 170 while leaving the nitride to define dielectric isolation layer 180. The resulting structure 100 includes an oxide layer 160 on the substrate 102 and the nanosheets as shown and a nitride dielectric isolation layer 180 between each of the nanosheet stacks and the oxide layer 160 formed on the substrate. The nanosheet stack includes a plurality of Si layers and SiGe(x) layers with the oxide layer 160 configured and arranged as shown.

Figure 7:
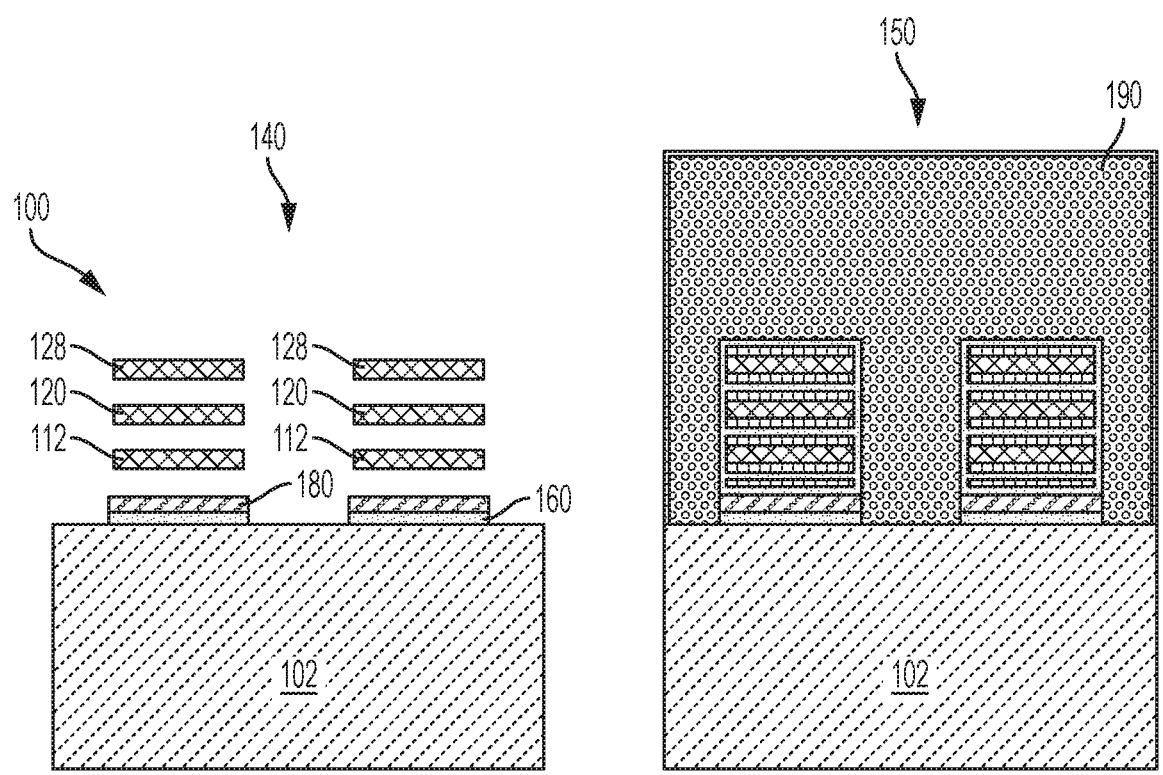
FIG. 7 depicts a cross-sectional view of the semiconductor structure after a fabrication operation according to one or more embodiments of the present invention.

FIG. 7 depicts a cross-sectional view of the semiconductor structure 100 of FIG. 6 subsequent to providing a block mask 190 over the pFET region 150 and selective removal of the oxide layer 160 and the SiGe(x) layers 106, 110, 114, 118, 126 and 130 from the nanosheet stacks in the NFET region 140. The block mask 190 can be an organic planarization layer applied to the substrate followed by lithographically patterning a photoresist thereon to open the NFET region. Once opened, the oxide layer can be removed by a wet etch process such as by a buffered oxide etch process, also known as buffered HF or BHF, which is a wet etch solution that can be applied for a period of time and at a temperature effective to selectively remove the oxide layer 160 from the exposed surfaces.

Figure 8:
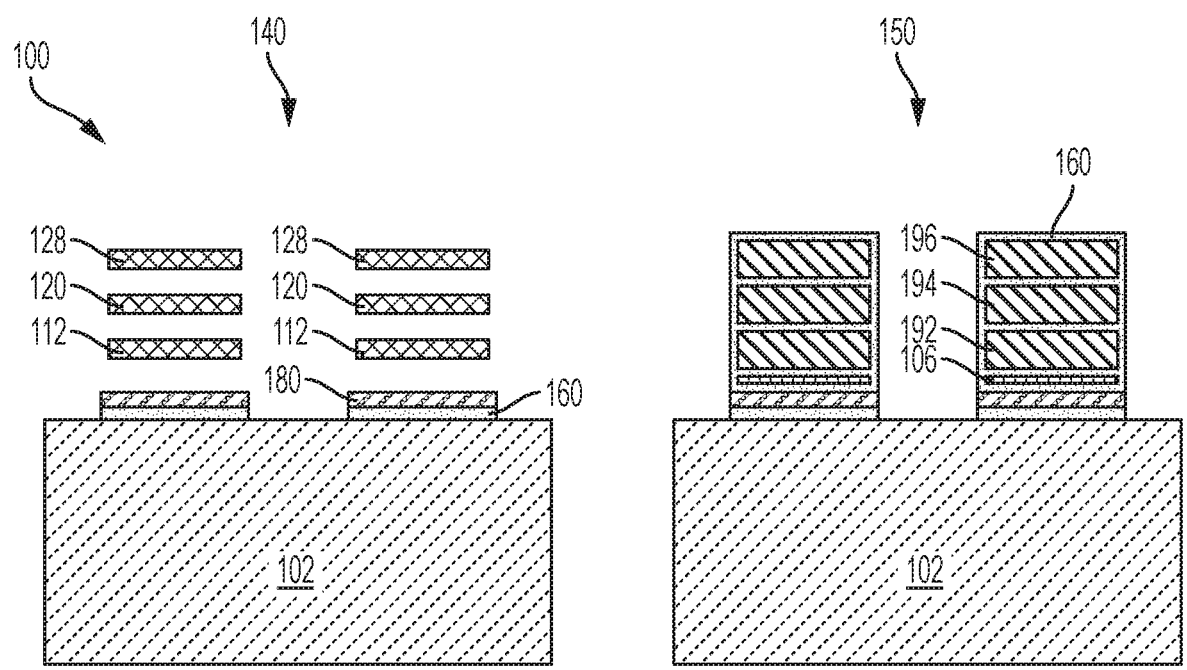
FIG. 8 depicts a cross-sectional view of the semiconductor structure after a fabrication operation according to one or more embodiments of the present invention.

FIG. 8 depicts a cross-sectional view of the semiconductor structure 100 of FIG. 7 subsequent to removal of the block mask 190 that was formed on the PFET region 150. The block mask can be removed by a dry or wet etch process. Additionally, the substrate is subjected to an annealing process to diffuse the germanium in the SiGe(x) layers into abutting silicon layers 112, 120, 128 in the PFET region so to form the p-type doped SiGe layer 192, 194, 196 having a reduced germanium content relative to SiGe(x). SiGe(x) layer 106 remains unchanged given that it does not abut a silicon layer and instead is encapsulated in the oxide layer 160.

Figure 9:
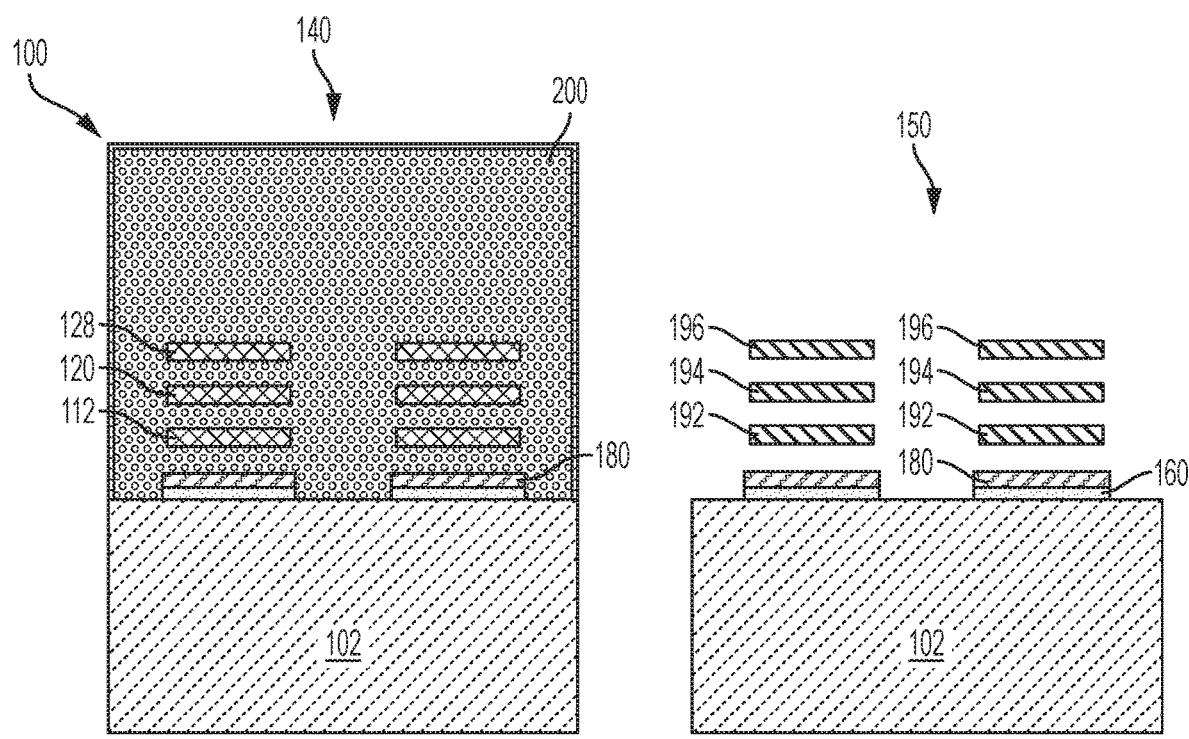
FIG. 9 depicts a cross-sectional view of the semiconductor structure after a fabrication operation according to one or more embodiments of the present invention.

FIG. 9 depicts a cross-sectional view of the semiconductor structure 100 of FIG. 8 subsequent to providing a block mask 200 over the NFET region 140 and selective removal of the oxide layer 160 and the SiGe(x) layer 106 in the PFET region 150. The block mask 200 can be an organic planarization layer applied to the substrate followed by lithographically patterning a photoresist thereon to open the PFET region. Once opened, the oxide layer 160 can be selectively removed from the PFET region 150 by a wet etch process such as by a buffered oxide etch process, also known as buffered HF or BHF, which is a wet etch solution that can be applied for a period of time and at a temperature effective to selectively remove the oxide layer 160 from the exposed surfaces. The SiGe layers 192, 194, and 196 can be thinned by applying a wet etch solution, e.g., applying an SC1 cleaning solution. The SC1 cleaning solution is an aqueous solution of $NH_4OH$, $H_2O_2$ and can be applied at an elevated temperature. The SC1 cleaning solution also removes SiGe (x) layer 106.

Figure 10:
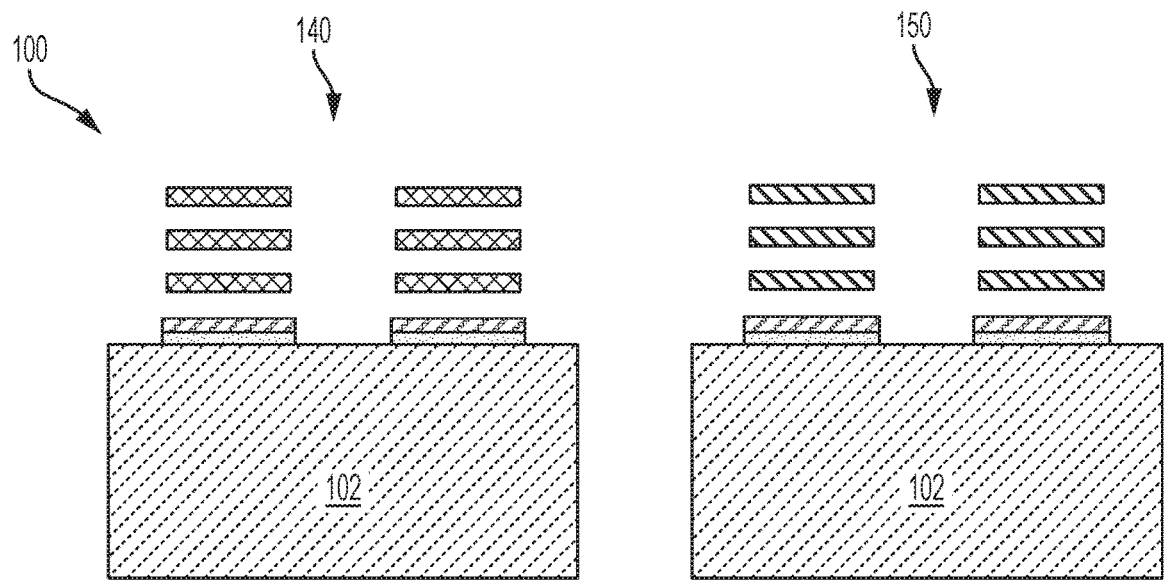
FIG. 10 depicts a cross-sectional view of the semiconductor structure.

FIG. 10 depicts a cross-sectional view of the semiconductor structure 100 of FIG. 9 subsequent to removal of the block mask 200 that was formed on the NFET region 140 to provide the final nanochannels structure. The block mask can be removed by a dry or wet etch process. As shown, the NFET region 140 includes n-type Si nanochannels and the PFET region 150 includes p-type SiGe nanochannels, wherein the nitride layer 180 provides effective dielectric isolation from the substrate 102.

Figure 11:
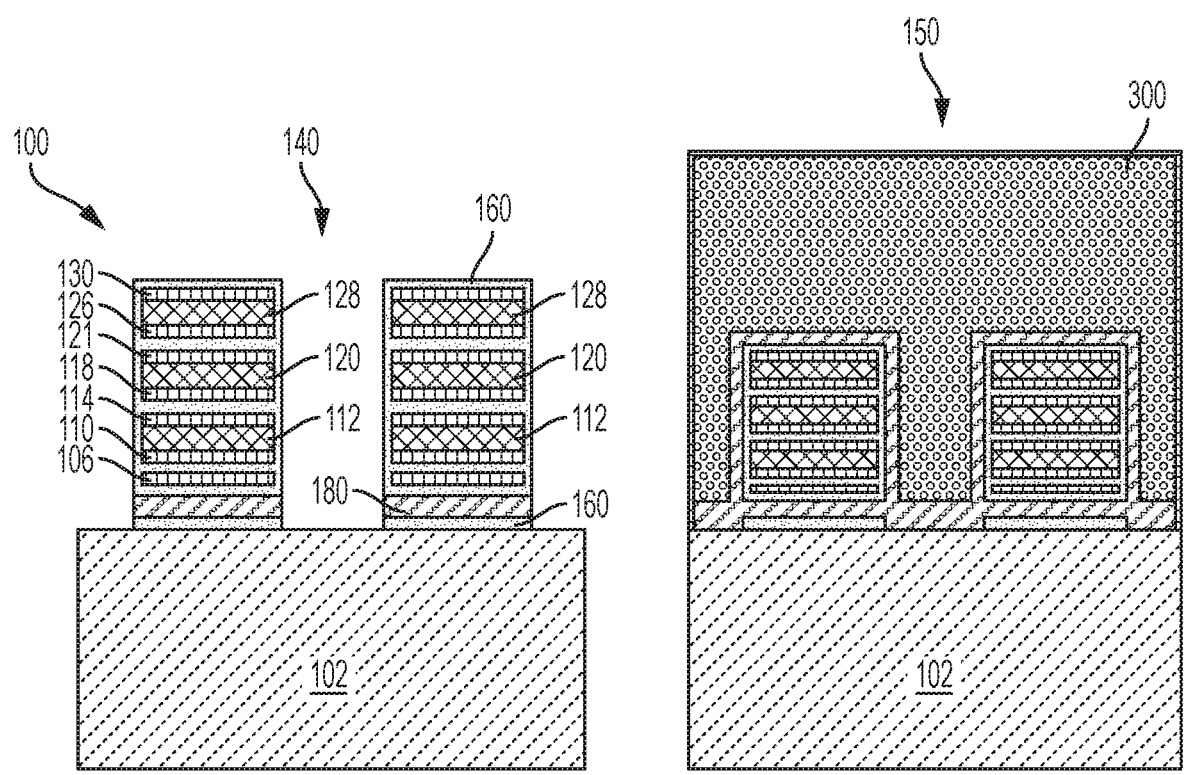
FIG. 11 depicts a cross-sectional view of the semiconductor structure after a fabrication operation according to one or more embodiments of the present invention.

In one or more other embodiments, FIG. 11 depicts a cross-sectional view of the semiconductor structure 100 of FIG. 5 subsequent to deposition and lithographic patterning of an organic planarizing layer to form a block mask 300 over the PFET region 150 and selective removal of the nitride layer 170 in the NFET region 140. The nitride layer can be removed by a directional etch process such as reactive ion etch, a SiCoNi dry cleaning process, a Certas dry cleaning process or the like so as to remove the exposed nitride layer 170 while leaving the nitride layer proximate to the substrate 102 and underlying the nanosheet stack to define the dielectric isolation layer 180.

Figure 12:
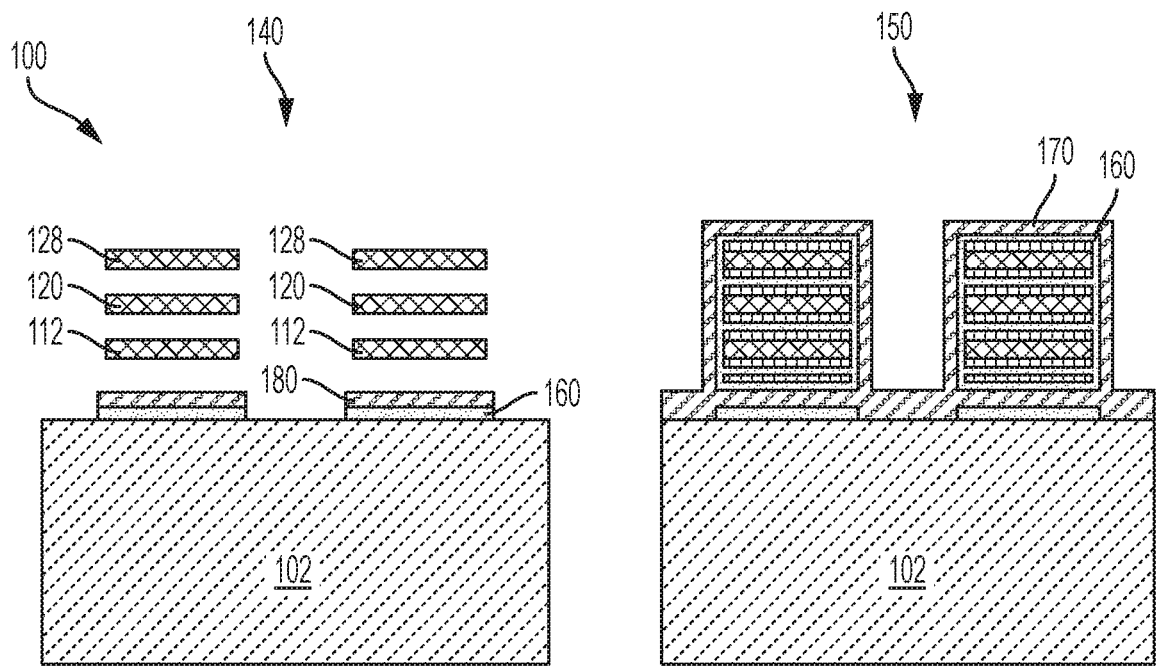
FIG. 12 depicts a cross-sectional view of the semiconductor structure after a fabrication operation according to one or more embodiments of the present invention.

FIG. 12 depicts a cross-sectional view of the semiconductor structure 100 of FIG. 11 subsequent to selective removal of the oxide layer 160 followed by selective removal of the SiGe(x) layers 106, 110, 114, 118, 126 and 130 from the nanosheet stacks in the NFET region 140. The oxide layer can be removed by a wet etch process such as by a buffered oxide etch process that can be applied for a period of time and at a temperature effective to selectively remove the oxide layer 160 from the exposed surfaces. The SiGe(x) layers can be selectively removed relative to Si by exposing the substrate 102 to SiCONi and HCl vapor. The block mask overlying the PFET region can then be removed using wet or dry etch chemistry specific for the organic planarizing layer. As such, the nitride layer 170 and oxide layer 160 remains about the nanosheets in the PFET region 150.

Figure 13:
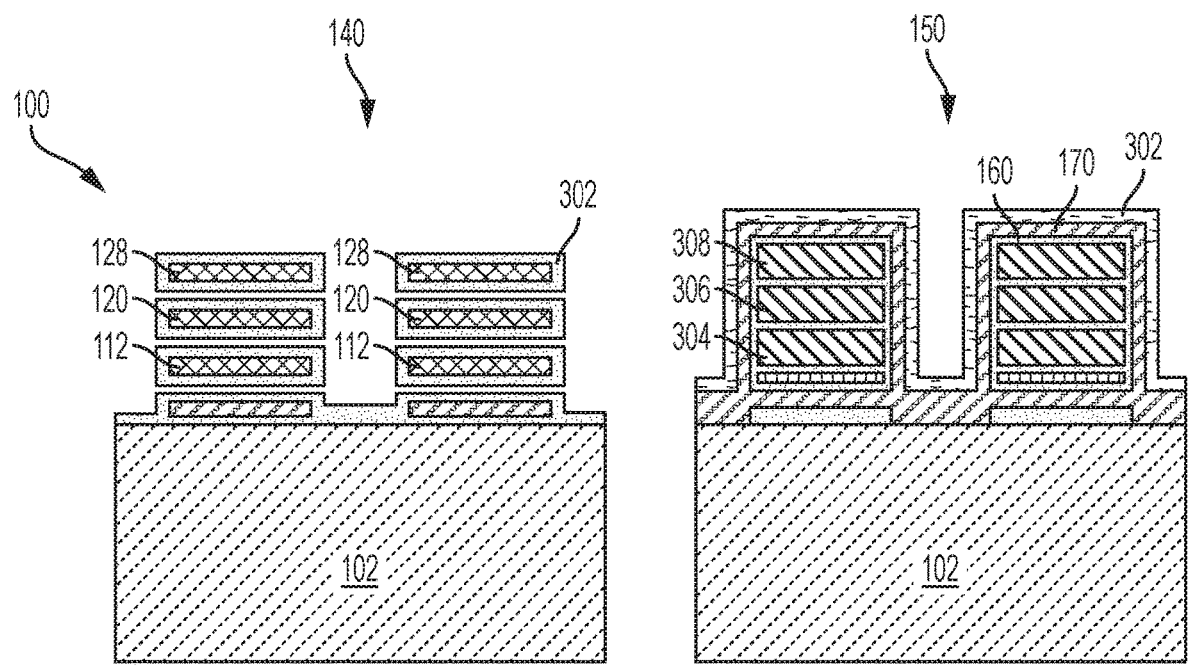
FIG. 13 depicts a cross-sectional view of a semiconductor structure after a fabrication operation according to one or more embodiments of the present invention.

FIG. 13 depicts a cross-sectional view of the semiconductor structure 100 of FIG. 12 subsequent to subjecting the substrate 102 to a diffusion anneal, wherein the germanium in SiGe(x) layers 110, 114, 118, 126 and 130 diffuse into the abutting Si layers 112, 120, 128 in the PFE region to form SiGe layers 304, 306, and 308. The diffusion anneal can include heating the substrate to a temperature of about 800° C. to about 1000° C. for a period of about 4 seconds to about 10 minutes. Additionally, an oxide layer 302 is deposited by atomic layer deposition on the substrate 102, which protects the structures.

Figure 14:
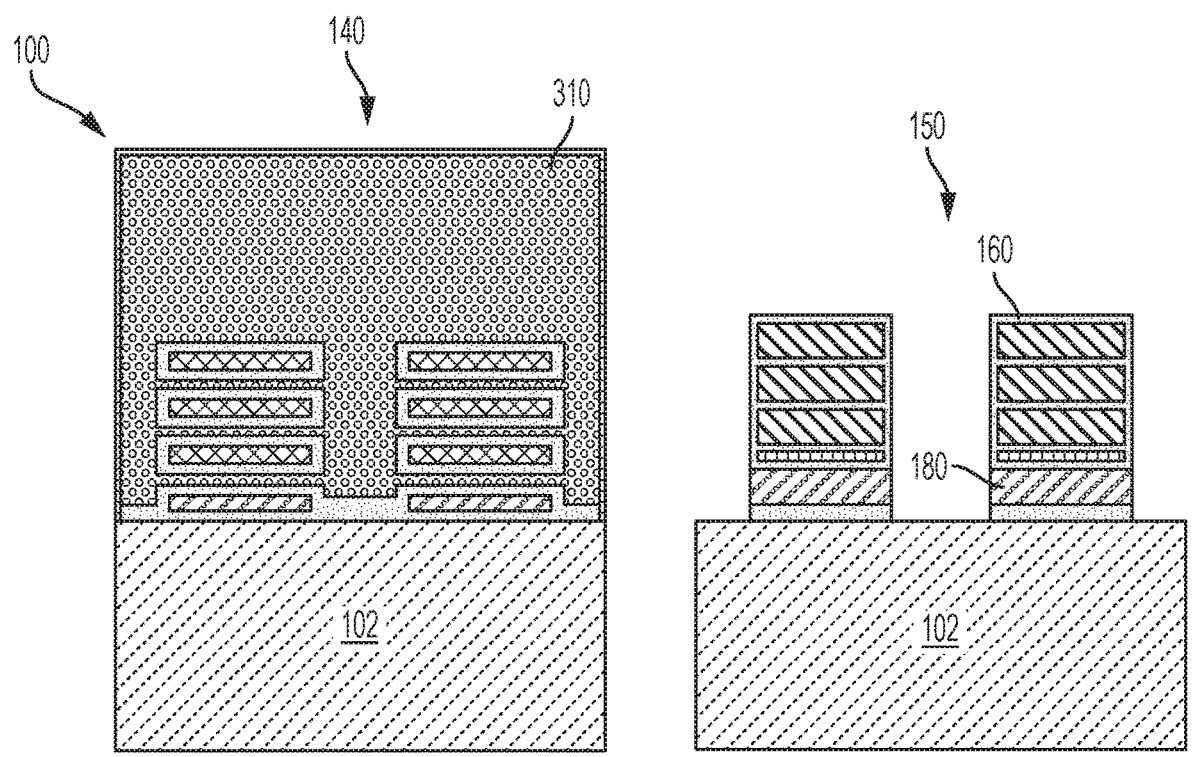
FIG. 14 depicts a cross-sectional view of the semiconductor structure after a fabrication operation according to one or more embodiments of the present invention.

FIG. 14 depicts a cross-sectional view of the semiconductor structure 100 of FIG. 13 subsequent to deposition and lithographic patterning of an organic planarizing layer to form a block mask 310 over the NFET region 140 followed by selective removal of the oxide layer 302 and nitride layer 170 in the PFET region 150.

Figure 15:
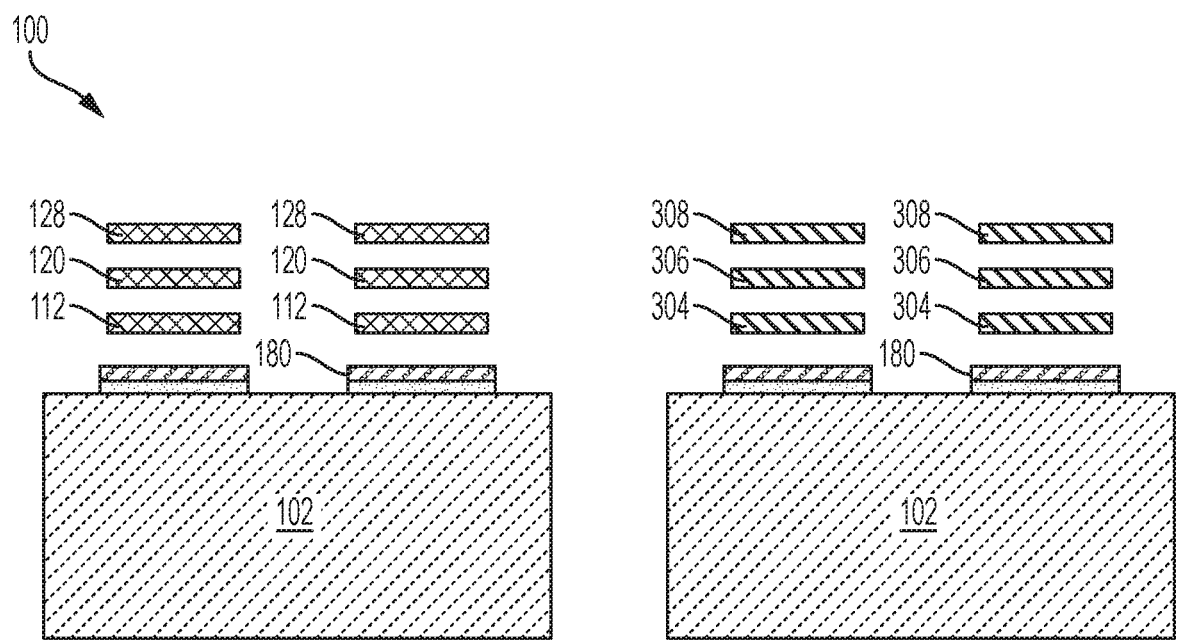
FIG. 15 depicts a cross-sectional view of the semiconductor structure after a fabrication operation according to one or more embodiments of the present invention.

FIG. 15 depicts a cross-sectional view of the semiconductor structure 100 of FIG. 14 subsequent to removal of the block mask 310 that was formed on the NFET region 140 followed by removal of the oxide layers 160 and 302 in the PFET region 150 and NFET region 140, respectively. Once the oxide layers are removed, the SiGe layers 304, 306, and 308 can be thinned and nitride layer 106 removed. The resulting structure provides the NFET region 140 with n-type Si nanochannels and the PFET region 150 with p-type SiGe nanochannels, wherein the nitride layer 180 provides effective dielectric isolation from the substrate 102.

Subsequently, a high-dielectric constant (high-k) layer (not shown) can deposited about the channel nanosheets as a gate dielectric and followed by the formation of metal gate (not shown) as is generally known in the art. Gate dielectric can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Gate conductor can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In some embodiments, a work function layer (not shown) is formed between the high-k dielectric and the gate material. The work function layer can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layer further modifies the work function of the gate material.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a complementary metal oxide semiconductor (CMOS) device, the method comprising:
epitaxially growing a multilayer structure on a substrate in an NFET region and a PFET region, the multilayer structure comprising alternating silicon layers, with a silicon layer sandwiched between SiGe(x) layers, and SiGe(x+25) layers sandwiched between the SiGe(x) layers, wherein a bottommost layer is a sacrificial dielectric isolation layer comprising the SiGe(x+25), wherein the sacrificial dielectric isolation layer is at thickness greater than each of the SiGe(x+25) layers sandwiched between the SiGe(x) layers, wherein (x) is from about 5 atomic percent to about 50 atomic percent;
patterning the multilayer structure to form one or more nanosheet stacks in the NFET region and the PFET region;
selectively removing the SiGe(x+25) layers from each of the nanosheet stacks in both the NFET and PFET regions, wherein selectively removing the SiGe(x+25) layers forms a space between each SiGe(x) layer of the multilayer structure and the substrate and a lowermost one of the SiGe(x) layers;
conformally depositing an oxide layer on the substrate, wherein the oxide layer is at a thickness effective to fill the space between each of the SiGe(x) layers and forming the oxide layer on the substrate;
conformally depositing a nitride layer on the substrate, wherein the nitride layer is at a thickness effective to fill the space between the lowermost one of the SiGe(x) layers and the substrate;
selectively removing the nitride layer such that the nitride layer remains in the space between the lowermost one of the SiGe(x) layers and the substrate;
blocking the PFET region with a block mask followed by removing the oxide layer and SiGe(x) layers from the at least one or more nanosheet stacks in the NFET region;
removing the block mask from the PFET region and heating the substrate to diffuse the germanium in each SiGe(x) layer into each silicon layer to form germanium diffused silicon layers in the PFET region;
blocking the NFET region with a block mask followed by removing the oxide layer and thinning each germanium diffused silicon layer from the nanosheet stack in the NFET region; and
removing the block mask from the NFET region.

2. The method of claim 1, wherein the block mask in the PFET region comprises depositing an organic planarizing layer onto the substrate, and lithographically patterning the organic planarizing layer to open the NFET region.

3. The method of claim 1, wherein the block mask in the NFET region comprises depositing an organic planarizing layer onto the substrate, and lithographically patterning the organic planarizing layer to open the PFET region.

4. The method of claim 1, wherein selectively removing the SiGe(x+25) layers from each of the nanosheet stacks in both the NFET and PFET regions comprises exposing the SiGe(x+25) layers to HCl vapor.

5. The method of claim 1, wherein (x) is from about 10 atomic percent to about 40 atomic percent.

6. The method of claim 1, wherein (x) is from about 20 atomic percent to about 30 atomic percent.

7. The method of claim 1, wherein removing the oxide layer in the PFET region and the NFET region comprises exposing the exposed surfaces of the oxide layer to a buffered hydrofluoric acid etch process.

8. The method of claim 1, wherein the SiGe(x) and the SiGe(x+25) layers are each at a thickness of about 2 to about 4 nm, the silicon layer is at a thickness of about 4 nm to about 8 nm; and the sacrificial dielectric isolation layer is at a thickness of about 8 nm to about 12 nm.

9. The method of claim 1, wherein the oxide layers and the nitride layers are deposited by atomic layer deposition.

10. The method of claim 1, wherein the heating the substrate to diffuse the germanium is at a temperature of about 800° C. to 1000° C. for about 4 second to 10 minutes.

11. A method for forming nanochannels in a complementary metal oxide semiconductor (CMOS) device, the method comprising:
epitaxially growing a sacrificial dielectric isolation layer at a thickness of about 8 nm to about 12 nm on a substrate, wherein the sacrificial dielectric isolation layer comprises SiGe(x+25);
epitaxially growing a multilayer structure on the sacrificial dielectric isolation layer, the multilayer structure comprising alternating silicon layers each at a thickness of about 4 nm to 8 nm sandwiched between SiGe(x) layers at a thickness of about 2 nm to 4 nm, and SiGe(x+25) layers at a thickness of about 2 nm to about 4 nm sandwiched between each of the SiGe(x) layers;
patterning the multilayer structure to form one or more nanosheet stacks in an NFET region and a PFET region;
selectively removing the SiGe(x+25) layers to form a first space between the SiGe(x) layers and a second space from between the sacrificial dielectric isolation region and the substrate;
conformally depositing an oxide layer at a thickness effective to fill each first space between the SiGe(x) layers;
conformally depositing a nitride layer on the substrate and at a thickness effective to fill the second space;
removing the nitride layer from surfaces other than the second space such that the nitride layer fills the second space and forms a dielectric isolation region between the substrate and each of the nanosheet stacks;
blocking the PFET region with a block mask followed by removing the oxide layer and the SiGe(x) layers from the one or more nanosheet stacks in the NFET region;
removing the block mask from the PFET region and heating the substrate to diffuse the germanium in the SiGe(x) layer into the silicon layer to form a germanium diffused silicon layer in the PFET region;
blocking the NFET region with a block mask followed by removing the oxide layer and thinning the germanium diffused silicon layer from the nanosheet stack in the NFET region; and
removing the block mask from the NFET region.

12. The method of claim 11, wherein the NFET region is separated from the PFET region by a shallow trench isolation region in the substrate.

13. The method of claim 11, wherein the oxide layers and the nitride layers are deposited by atomic layer deposition.

14. The method of claim 11, wherein selectively removing the SiGe(x+25) layers is at an etch selectivity greater than 30:1 relative to the SiGe(x) layers.

15. The method of claim 11, wherein selectively removing the SiGe(x) layers comprises exposing the SiGe(x) layers to an HCl vapor.

16. The method of claim 11 further comprising thinning the germanium diffused silicon layer in the PFET region with a wet etch process.

17. A method for forming nanochannels in a complementary metal oxide semiconductor (CMOS) device, the method comprising:

epitaxially growing a sacrificial dielectric isolation layer at a thickness of about 8 nm to about 12 nm on a substrate, wherein the sacrificial dielectric isolation layer comprises SiGe(x+25);

epitaxially growing a multilayer structure on the sacrificial dielectric isolation layer, the multilayer structure comprising alternating silicon layers each at a thickness of about 4 nm to 8 nm sandwiched between SiGe(x) layers at a thickness of about 2 nm to 4 nm, and SiGe(x+25) layers at a thickness of about 2 nm to about 4 nm sandwiched between the SiGe(x) layers;

patterning the multilayer structure to form one or more nanosheet stacks in an NFET region and a PFET region;

selectively removing the SiGe(x+25) layers material layers to form a first space between each of the SiGe(x) layers and a second space between the sacrificial dielectric isolation region and the substrate;

conformally depositing a first oxide layer at a thickness effective to fill each first space between the SiGe(x) layers;

depositing a nitride layer at a thickness effective to fill the second space;

blocking the PFET region with a block mask followed by removing the nitride layer from surfaces other than the second space such that the nitride layer fills the second space and forms a dielectric isolation region between the substrate and each of the nanosheet stacks in the NFET region;

selectively removing the SiGe(x) layers from the one or more nanosheet stacks in the NFET region;

conformally depositing a second layer on the silicon layers and the dielectric isolation region in the NFET region, and the one or more nanosheet stacks in the PFET region;

heating the substrate to diffuse the germanium in the SiGe(x) layer into the silicon layer to form a germanium diffused silicon layer in the PFET region;

blocking the NFET region with a block mask followed by removing the second oxide layer and the nitride layer from the nanosheet stack in the NFET region; and removing the block mask from the NFET region followed by simultaneously removing the second oxide layer in the NFET region and the first oxide layer in the PFET region.

18. The method of claim 17, wherein removing the first oxide layer in the PFET region thins the germanium diffused silicon layer in the PFET region.

19. The method of claim 17, wherein the SiGe(x+25) has a germanium content at least 25 atomic percent greater than the SiGe(x).

20. The method of claim 17, wherein selectively removing the SiGe(x+25) layers relative to the SiGe(x) layers comprises exposing the substrate to an HCl vapor.

* * * * *